United States Patent
Spyropoulos et al.

(10) Patent No.: US 11,959,793 B2
(45) Date of Patent: Apr. 16, 2024

(54) FLOW METROLOGY CALIBRATION FOR IMPROVED PROCESSING CHAMBER MATCHING IN SUBSTRATE PROCESSING SYSTEMS

(71) Applicant: LAM RESEARCH CORPORATION, Fremont, CA (US)

(72) Inventors: Evangelos T. Spyropoulos, San Jose, CA (US); Piyush Agarwal, Newark, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 216 days.

(21) Appl. No.: 17/641,240

(22) PCT Filed: Sep. 10, 2020

(86) PCT No.: PCT/US2020/050099
§ 371 (c)(1),
(2) Date: Mar. 8, 2022

(87) PCT Pub. No.: WO2021/050663
PCT Pub. Date: Mar. 18, 2021

(65) Prior Publication Data
US 2022/0333972 A1    Oct. 20, 2022

Related U.S. Application Data

(60) Provisional application No. 62/898,825, filed on Sep. 11, 2019.

(51) Int. Cl.
*G01F 25/10* (2022.01)
*G01F 15/04* (2006.01)
(Continued)

(52) U.S. Cl.
CPC ............ *G01F 25/15* (2022.01); *G01F 15/043* (2013.01); *H01J 37/32449* (2013.01);
(Continued)

(58) Field of Classification Search
CPC .......... G01F 25/15; G01F 25/10; G01F 15/10; G01F 15/17; G01F 15/04; G01F 15/043;
(Continued)

(56) References Cited

U.S. PATENT DOCUMENTS

| 7,822,570 B2 | 10/2010 | Shareef et al. |
| 2008/0140260 A1* | 6/2008 | Ding ................... G05B 13/042 700/282 |

(Continued)

FOREIGN PATENT DOCUMENTS

| EP | 1386203 B1 | 7/2007 |
| JP | 2011064707 A | 3/2011 |

OTHER PUBLICATIONS

International Search Report and Written Opinion of the ISA issued in PCT/US2020/050099, dated Dec. 22, 2020; ISA/KR.

*Primary Examiner* — Herbert K Roberts

(57) ABSTRACT

A method for calibrating a gas flow metrology system for a substrate processing system includes a) measuring temperature using a first temperature sensor and a reference temperature sensor over a predetermined temperature range and determining a first transfer function; b) measuring pressure using a first pressure sensor and a reference pressure sensor over a predetermined pressure range using a first calibration gas and determining a second transfer function; c) performing a first plurality of flow rate measurements in a predetermined flow rate range with a first metrology system and a reference metrology system, wherein the first metrology system and the reference metrology system use a first orifice size and the first calibration gas; and d) scaling temperature and pressure using the first transfer function and the second transfer function, respectively, and determining a corresponding transfer function for the first calibration gas based on the first plurality of flow rate measurements.

8 Claims, 10 Drawing Sheets

(51) Int. Cl.
*H01J 37/32* (2006.01)
*H01L 21/67* (2006.01)

(52) U.S. Cl.
CPC .............. *H01J 37/32091* (2013.01); *H01J 2237/24585* (2013.01); *H01L 21/67253* (2013.01)

(58) Field of Classification Search
CPC ... G01F 1/34; G01F 1/36; G01F 1/363; G01F 1/366; G01F 1/37; G01F 1/372; G01F 1/375; G01F 1/377; G01F 1/38; G01F 1/383; G01F 1/386; G01F 1/40; G01F 1/42; G01F 1/44; G01F 1/46
See application file for complete search history.

(56) References Cited

U.S. PATENT DOCUMENTS

| | | | |
|---|---|---|---|
| 2009/0019943 A1 | 1/2009 | Ozawa et al. | |
| 2013/0081702 A1 | 4/2013 | Mohammed et al. | |
| 2017/0261448 A1 | 9/2017 | Brun et al. | |
| 2018/0120864 A1* | 5/2018 | El-Shaer | G05D 7/0623 |
| 2019/0212176 A1 | 7/2019 | Miyoshi et al. | |
| 2022/0099470 A1* | 3/2022 | Zhu | G01F 7/00 |

* cited by examiner

FLOW METROLOGY CALIBRATION FOR IMPROVED PROCESSING CHAMBER MATCHING IN SUBSTRATE PROCESSING SYSTEMS

CROSS-REFERENCE TO RELATED APPLICATIONS

The present disclosure is a U.S. National Phase Application under 35 U.S.C. 371 of International Application No. PCT/US2020/050099, filed on Sep. 10, 2020, which claims the benefit of U.S. Patent Application No. 62/898,825 filed on Sep. 11, 2019. The entire disclosures of the applications referenced above are incorporated herein by reference.

FIELD

The present disclosure relates to flow metrology for substrate processing systems, and more particularly to flow metrology calibration in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, etching, deposition and cleaning processes. During processing, a substrate is arranged on a substrate support, such as a pedestal, an electrostatic chuck (ESC), etc. in a processing chamber of the substrate processing system. A gas delivery system supplies a gas mixture into the processing chamber to treat the substrate. Plasma may be struck to enhance chemical reactions within the processing chamber. An RF bias may also supplied to the substrate support to control ion energy.

To improve quality and reduce defects, one or more metrology systems may be used to verify operation of the processing chamber. For example, a flow metrology system may be used to verify flow rates of mass flow controllers in a gas delivery system supplying the gas mixture.

SUMMARY

A method for calibrating a gas flow metrology system for a substrate processing system includes a) measuring temperature using a first temperature sensor and a reference temperature sensor over a predetermined temperature range and determining a first transfer function; b) measuring pressure using a first pressure sensor and a reference pressure sensor over a predetermined pressure range using a first calibration gas and determining a second transfer function; c) performing a first plurality of flow rate measurements in a predetermined flow rate range with a first metrology system and a reference metrology system, wherein the first metrology system and the reference metrology system use a first orifice size and the first calibration gas; and d) scaling temperature and pressure using the first transfer function and the second transfer function, respectively, and determining a corresponding transfer function for the first calibration gas based on the first plurality of flow rate measurements.

In other features, the method includes e) performing a second plurality of flow rate measurements in the predetermined flow rate range with the first metrology system and the reference metrology system, wherein the first metrology system and the reference metrology system use the first orifice size and a second calibration gas, and wherein the second calibration gas has a molecular weight that is different than a molecular weight of the first calibration gas. The method includes f) scaling temperature and pressure using the first transfer function and the second transfer function, respectively, and determining a corresponding transfer function for the second calibration gas based on the second plurality of flow rate measurements. The second calibration gas has a molecular weight that is lower than the molecular weight of the first calibration gas.

In other features, the method includes g) performing a third plurality of flow rate measurements in the predetermined flow rate range with the first metrology system and the reference metrology system, wherein the first metrology system and the reference metrology system use the first orifice size and a third calibration gas, and wherein the third calibration gas has a molecular weight that is different than the molecular weight of the first calibration gas and the second calibration gas. The method includes h) scaling temperature and pressure using the first transfer function and the second transfer function, respectively, and determining a corresponding transfer function for the third calibration gas based on the third plurality of flow rate measurements. The third calibration gas has a molecular weight that is higher than the molecular weight of the first calibration gas and the second calibration gas.

In other features, the method includes (i) calculating a corresponding transfer function for an additional gas by performing interpolation between transfer function values of the corresponding transfer functions for at least two of the first calibration gas, the second calibration gas and the third calibration gas. The interpolation is based on a molecular weight of the additional gas relative to the corresponding molecular weights of at least two of the first calibration gas, the second calibration gas and the third calibration gas. Measuring temperature further comprises using a controlled heat source to increase temperature in a step-wise fashion in the predetermined temperature range. The first metrology system and the reference metrology system are orifice-based metrology systems.

In other features, the method includes repeating a) to i) for one or more additional gases. The method includes repeating a) to i) for another orifice having a different size than the first orifice size.

A calibration system for an orifice-based flow metrology system includes a gas box including valves and mass flow controllers to selectively supply a first calibration gas, a second calibration gas and a third calibration gas. A first metrology system includes a first temperature sensor, a first pressure sensor and a first orifice having a first orifice size. A reference metrology system includes a second temperature sensor, a second pressure sensor and a second orifice having the first orifice size. A controlled heating source is configured to heat the first temperature sensor and the second temperature sensor. A controller is configured to a) cause the controlled heating source to heat the first temperature sensor and the second temperature sensor to a plurality of temperatures in a predetermined operating temperature range; b) cause a first transfer function to be generated based on first and second temperatures sensed by the first and second temperature sensors, respectively; c) cause a first calibration gas to be supplied at a plurality of pressures in a predetermined pressure range and a second transfer function to be generated based on first and second pressures sensed by the first and second pressure sensors, respectively; d) cause a first plurality of flow rate measurements to be performed in a predetermined flow rate range with the first metrology system and the reference metrology system, wherein the first metrology system and the reference metrology system use the first calibration gas; and e) cause temperature and pressure to be calibrated using the first transfer function and the second transfer function, respectively, and a corresponding transfer function to be determined for the first calibration gas based on the first plurality of flow rate measurements.

In other features, the controller is further configured to cause: f) a second plurality of flow rate measurements to be performed in the predetermined flow rate range with the first metrology system and the reference metrology system, wherein the first metrology system and the reference metrology system use the second calibration gas having a molecular weight that is different than a molecular weight of the first calibration gas; and g) temperature and pressure to be calibrated using the first transfer function and the second transfer function, respectively, and a corresponding transfer function to be determined for the second calibration gas based on the second plurality of flow rate measurements. The molecular weight of the second calibration gas is lower than the molecular weight of the first calibration gas.

In other features, the controller is further configured to cause: h) a third plurality of flow rate measurements to be performed in the predetermined flow rate range with the first metrology system and the reference metrology system, wherein the first metrology system and the reference metrology system use the third calibration gas having a molecular weight that is different than the molecular weight of the first calibration gas and the second calibration gas; and i) temperature and pressure to be calibrated using the first transfer function and the second transfer function, respectively, and a corresponding transfer function to be determined for the third calibration gas based on the third plurality of flow rate measurements. The molecular weight of the third calibration gas is higher than the molecular weight of the first calibration gas and the second calibration gas.

In other features, the controller is further configured to cause j) a corresponding transfer function to be calculated for an additional gas by performing interpolation between transfer function values of the corresponding transfer functions for at least two of the first calibration gas, the second calibration gas and the third calibration gas. The controller is configured to repeat a) to j) for one or more additional gases. The controller is configured to repeat a) to j) for another orifice having a different size than the first orifice size.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
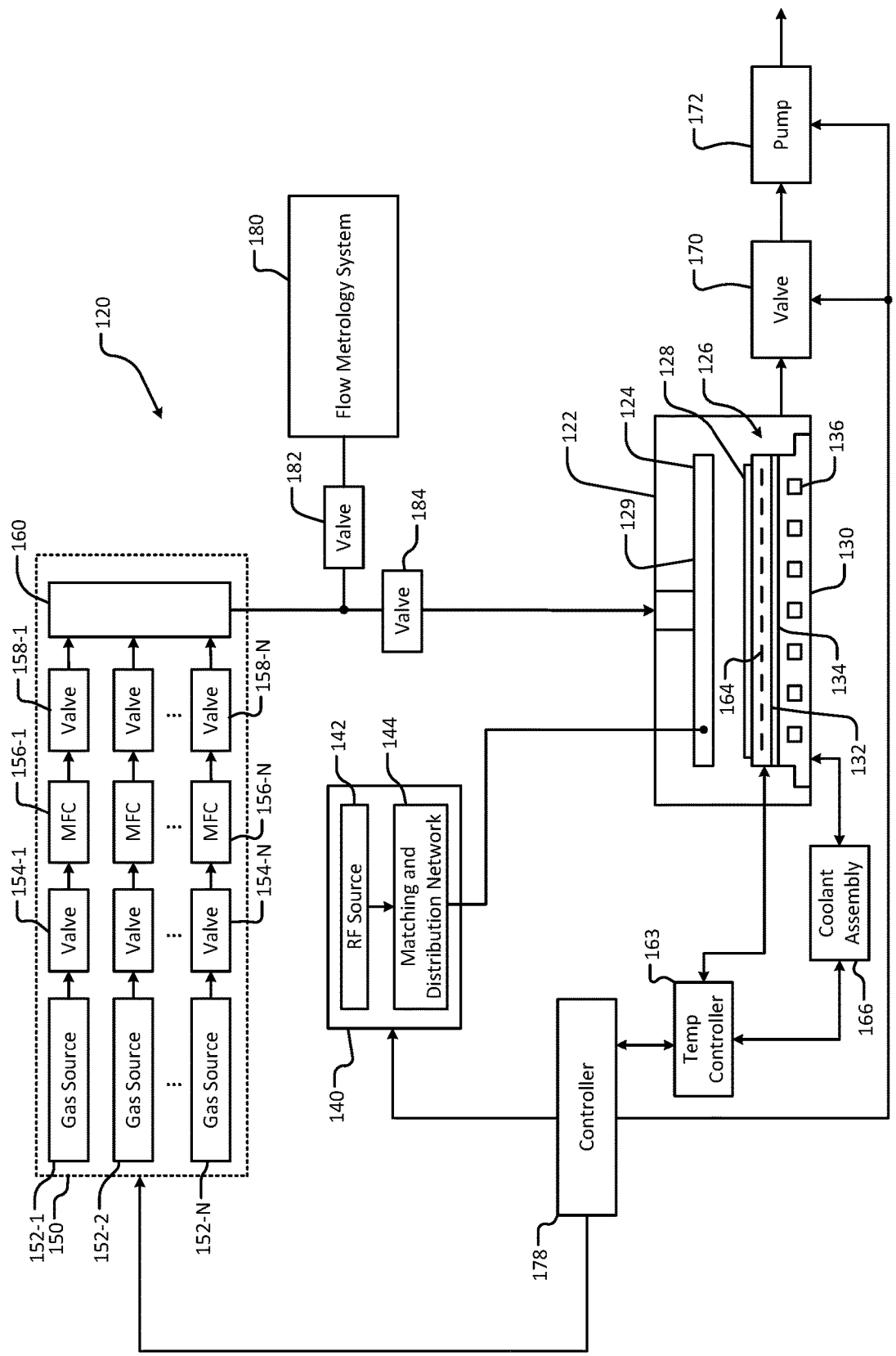
FIG. 1 is a functional block diagram of an example of a substrate processing system.

Orifice-based flow metrology systems such as absolute flow verification (AFV) are used to confirm flow rates of mass flow controllers (MFCs). During testing, gas is supplied through a mass flow controller (MFC), an orifice bank and a pump. The orifice bank includes a plurality of precision orifices. One of the precision orifices is selected using a corresponding valve for the gas and flow rate ranges that are used.

After initiating flow, pressure upstream from the selected precision orifice increases to a steady state pressure. The pressure is monitored by a pressure sensor such as a manometer. The pressure value is used to determine the flow rate based on an empirically developed gas table that relates orifice pressure to gas flow rate on a per gas basis. A temperature correction may also be applied to account for temperature variations and to determine the actual gas flow rate of the MFC. Additional details relating to AFV can be found in commonly-assigned U.S. Pat. No. 7,822,570, which issued on Oct. 26, 2010 and is entitled "Methods for Performing Actual Flow Verification", which is hereby incorporated by reference in its entirety.

An orifice selection is made depending on the gas type and flow rate set point. The orifice needs to be in a choked flow condition and orifice upstream pressure needs to be within a predetermined pressure range for accurate flow measurement. The gas flow then is directed through the selected orifice by opening a valve located upstream from the orifice and closing other valves associated with the other orifices. The upstream orifice pressure is monitored until the pressure stabilizes to a steady state pressure value. The steady state pressure value is used to determine the flow rate from the gas table that relates upstream orifice pressure to gas flow rate. The steady state temperature is also measured, and a temperature correction is applied to the flow rate value from the gas table to obtain the true MFC flow rate.

There are several factors that may affect the accuracy of the unit-to-unit repeatability of orifice-based gas metrology systems described above. One factor relates to the accuracy of the gas table to obtain the absolute flow rate. Another factor relates to the tuning of the temperature sensors, pressure sensors and other devices to mimic the performance of the golden standard devices that were used to generate the gas table. Once the flow metrology system is tuned, the within-unit repeatability can be affected by possible drift over time of the manometer and temperature sensors. Other causes of error include potential gas leaks or orifice clogging due to particle contamination. These factors can be controlled to ensure the device remains healthy, which makes orifice-based metrology systems highly accurate, repeatable and robust.

On the other hand, unit-to-unit repeatability is much more difficult to achieve since there are several key factors that can affect reproducibility. In choked internal gas flows through an orifice, small geometric variations in orifice geometry due to manufacturing tolerances (i.e., small variations on orifice hole size) can lead to significant variation on pressure build-up and, thus, affect accuracy of flow rate prediction. Since the choked flow condition is linearly proportional to pressure, manometer-manometer accuracy variations are also important.

Choked flow is also proportional to a square root of the gas temperature. Flow rate prediction can be affected by approximately +/−0.2% per ° C. of temperature variation in the thermal sensors. Proper tuning of each manufactured orifice-based metrology system ensures unit-to-unit reproducibility as well as within-unit accurate flow predictions.

A single calibration factor (CF) may be used for each orifice to scale the measured pressure for a better match against the golden standard device. The CF is determined experimentally at a choked flow condition using a predetermined gas (i.e., an inert gas such as $N_2$). While this method can provide excellent matching at the single gas flow condition and for the specific gas used for calibration, it can lead to errors and sudden jumps when predicting the actual (true) mass flow rate at other gas flow set points or for other gases.

Systems and methods for flow calibration according to the present disclosure optimize flow metrology system-device matching and absolute flow prediction. For semiconductor applications, the method improves MFC absolute flow measurement and chamber-chamber flow matching.

According to the present disclosure, improvements to the overall accuracy error are accomplished by performing several steps. Separate calibration is performed for each temperature sensor to match the temperature sensors to the golden temperature sensor. Separate calibration is performed for each manometer to match the golden manometer. Separate calibration is performed to account for orifice-orifice geometric variations plus flow effects due to differences in gas-gas properties.

The calibration parameters are defined using discrete transfer functions determined during manufacturing using an automated calibration fixture. In a first calibration step for calibrating a Unit-Under-Test (UUT) temperature sensor, the UUT temperature sensor is connected temporarily next to the golden temperature sensor. A controlled heat source raises the temperature gradually in steps in a predetermined operating temperature range of the metrology system. Multiple sensors can be connected and tuned if desired.

A discrete transfer function is developed for each UUT temperature sensor defined as follows:

$$f_T(T) = \frac{T_G}{T} \quad (1)$$

where T and $T_G$ denote the temperature readings from the UUT sensor and from the golden sensor respectively. The UUT temperature sensor reading T can be scaled to mimic the performance of the golden temperature sensor as follows:

$$\bar{T} = T * f_T(T) \quad (2)$$

The UUT sensor is then connected to the UUT metrology system in preparation for manometer tuning.

During a second calibration step, the UUT manometer is connected in parallel with the golden manometer to create a common manifold. The pressure in the manifold is measured by the UUT manometer and the golden manometer.

The common manifold is then pressurized gradually in numerous steps with a predetermined calibration gas such as $N_2$ (or any other gas). As the pressure is increased in steps, sufficient time is allowed between the steps to eliminate gas kinetic energy and achieve a steady state condition in which the gas remains stationary and at the same pressure and temperature. The golden manometer reading $p_G$ and the UUT manometer reading p are recorded and a discrete transfer function is developed as a function of pressure defined as follows:

$$f_m(p) = \frac{p_G}{p} \quad (3)$$

The UUT manometer reading p can be scaled to mimic the performance of the golden manometer as follows:

$$\bar{p} = p * f_m(p) \quad (4)$$

At this point, well-defined, discrete transfer functions have been developed to characterize and match the UUT manometers and temperature sensors to the golden standard devices. In addition, this tuning method allows for field replacement of a manometer or temperature sensor in case of failure in the future and eliminates the need for replacing the complete metrology system, which reduces cost and minimizes potential tool down time.

In a third calibration step, the system is calibrated to account for geometrical variations of the precision orifice as well as flow rate and variations on gas properties. With the UUT metrology system connected in parallel with the golden metrology system, MFC flow through each orifice is allowed by opening and closing appropriate valves. A series of absolute flow measurements is conducted using a predetermined gas such as $N_2$. Measurements are conducted at different flow set points to cover the complete operating flow range of each orifice.

Each measurement is performed first using the golden device and then the measurement is repeated using the UUT device. For the UUT measurements, the pressure is scaled using the temperature sensor and manometer discrete transfer functions that were determined during the previous steps. A discrete transfer function is then developed for each orifice as a function of orifice pressure defined as follows:

$$f_{orifice_i}^{N_2}(\bar{p}) = \frac{p_G}{\bar{p}}\sqrt{\frac{\bar{T}}{T_G}} \quad (5)$$

The third calibration step is repeated using a lighter calibration gas (e.g., He) and a heavier calibration gas (e.g., $C_4F_8$). Similar discrete transfer functions are generated based on the pressure and temperature from the golden and UUT devices for each flow case:

$$f_{orifice_i}^{He}(\overline{p}) = \frac{p_G}{\overline{p}} \sqrt{\frac{T}{T_G}} \quad (6)$$

$$f_{orifice_i}^{C_4F_8}(\overline{p}) = \frac{p_G}{\overline{p}} \sqrt{\frac{T}{T_G}} \quad (7)$$

Depending on the application, different sets of calibration gases can be chosen. However, He, $N_2$ and $C_4F_8$ are good choices for semiconductor etch tools, although other calibration gases can be used.

After determining the transfer functions (e.g. $f_{orifice_i}^{N_2}(\overline{p})$, $f_{orifice_i}^{He}(\overline{p})$ and $f_{orifice_i}^{C_4F_8}(\overline{p})$) experimentally during manufacturing as described above, the calibration function for any other gas can be computed with high accuracy using interpolation based on gas molecular weight, MW. For example, the calibration function for any other gas can be computed with high accuracy using linear interpolation based on gas molecular weight as follows:

If $MW_{gas} > MW_{N_2}$, then $$f_{orifice_i}^{gas}(\overline{p}) = \frac{\left[f_{orifice_i}^{C_4F_8}(\overline{p}) - f_{orifice_i}^{N_2}(\overline{p})\right]}{(MW_{C_4F_8} - MW_{N_2})}(MW_{gas} - MW_{N_2}) + f_{orifice_i}^{N_2}(\overline{p})$$

Similarly, for lighter gases with $MW_{gas} < MW_{N_2}$:

$$f_{orifice_i}^{gas}(\overline{p}) = \frac{\left[f_{orifice_i}^{N_2}(\overline{p}) - f_{orifice_i}^{He}(\overline{p})\right]}{(MW_{N_2} - MW_{He})}(MW_{gas} - MW_{N_2}) + f_{orifice_i}^{N_2}(\overline{p}) \quad (9)$$

In other words, as described in the above example, the calibration function for any other gas can be computed from the predetermined calibration factors for $N_2$ and $C_4F_8$ if the molecular weight of the gas is greater than the molecular weight of $N_2$, or from the predetermined calibration factors for $N_2$ and He if the molecular weight of the gas is less than the molecular weight of $N_2$.

In some embodiments, multiple predetermined gases can be used as reference. Correspondingly, a higher order interpolation can be used, which can increase the accuracy with which the calibration function for any other gas can be computed. Alternatively, two calibration gases—a first gas having a low molecular weight (e.g., He) and a second gas having a relatively heavy molecular weight (e.g., $C_4F_8$) can be used as the predetermined gases, and interpolation can be performed using a single interpolation equation similar to Eq. 8 or 9 to compute a calibration function for a gas having any molecular weight.

The variable calibration factors defined above can be used to calibrate with much higher accuracy the orifice pressure $\overline{p}$ from:

$$\tilde{p} = \overline{p} * f_{orifice_i}^{gas}(\tilde{p}) \quad (10)$$

Once steady state is reached, a first estimate Q of the MFC actual flow rate is then extracted from the golden unit gas table based on the calibrated gas pressure $\tilde{p}$. The gas table relates orifice pressure to absolute flow rate and was generated a priori using the golden unit at some predefined temperature $T_{gt}$. So, in order to obtain the actual flow rate $\overline{Q}$ at the gas temperature T, a temperature correction is applied as follows:

$$\overline{Q} = Q * \sqrt{\frac{T_{gt}}{T}} \quad (11)$$

Adjusting the measured temperature and pressure with the calibration method of equations 2 and 10, respectively, provides a more accurate measurement of actual MFC flow rate. In some examples, the proposed calibration method significantly improves the calibration of production flow metrology units to better than +/−0.1% unit-to-unit repeatability.

As is suggested by the experimental test data below, the flow metrology calibration according to the present disclosure significantly improves calibration of production devices and reduces unit-to-unit performance variation to less than +/−0.1%. Such reduction in unit-to-unit variation for correcting MFC flow anomalies improves chamber matching.

Furthermore, the proposed calibration method provides a significant improvement in accuracy of flow rate measurement since it provides much better matching of each production unit with the performance of the proven golden reference device for all gases and for the complete range.

Referring now to FIG. 1, an example substrate processing system 120 is shown. While an example of a processing chamber for etching, chemical vapor deposition or atomic layer deposition (ALD) using capacitively coupled plasma (CCP) is shown, the flow metrology systems and methods described herein can be used in any other type of system or substrate processing system. For example, the flow metrology systems and methods described herein can be used in substrate processing systems using remote plasma or inductively coupled plasma (ICP). Additionally, the systems and methods described herein can be used in any other semiconductor equipment requiring precise flow metrology.

The substrate processing system 120 includes a processing chamber 122 that encloses other components of the substrate processing system 120 and contains the RF plasma (if used). The substrate processing system 120 includes an upper electrode 124 and a substrate support 126 such as an electrostatic chuck (ESC). During operation, a substrate 128 is arranged on the substrate support 126.

For example only, the upper electrode 124 may include a gas distribution device 129 such as a showerhead that introduces and distributes process gases. The gas distribution device 129 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The substrate support 126 includes a baseplate 130 that acts as a lower electrode. The baseplate 130 supports a heating plate 132, which may correspond to a ceramic multi-zone heating plate. A thermal resistance layer 134 may be arranged between the heating plate 132 and the baseplate 130. The baseplate 130 may include one or more channels 136 for flowing coolant through the baseplate 130.

If plasma is used, an RF generating system 140 generates and outputs an RF voltage to one of the upper electrode 124 and the lower electrode (e.g., the baseplate 130 of the substrate support 126). The other one of the upper electrode 124 and the baseplate 130 may be DC grounded, AC grounded or floating. For example only, the RF generating system 140 may include an RF source 142 that generates RF power that is fed by a matching and distribution network 144 to the upper electrode 124 or the baseplate 130. In other examples, the plasma may be generated inductively or remotely.

A typical gas delivery system 150 includes one or more gas sources 152-1, 152-2, . . . , and 152-N (collectively gas sources 152), where N is an integer greater than zero. The gas sources 152 are connected by first valves 154-1, 154-2, . . . , and 154-N (collectively first valves 154) and MFCs 156-1, 156-2, . . . , and 156-N (collectively MFCs 156) to a manifold 160. Second valves 158-1, 158-2, . . . , and 158-N (collectively second valves 158) may be used between the MFCs 156 and the manifold 160. While a single gas delivery system 150 is shown, two or more gas delivery systems can be used.

A temperature controller 163 may be connected to a plurality of thermal control elements (TCEs) 164 arranged in the heating plate 132. The temperature controller 163 may be used to control the plurality of TCEs 164 to control a temperature of the substrate support 126 and the substrate 128. The temperature controller 163 may communicate with a coolant assembly 166 to control coolant flow through the channels 136. For example, the coolant assembly 166 may include a coolant pump, a reservoir and/or one or more temperature sensors. The temperature controller 163 operates the coolant assembly 166 to selectively flow the coolant through the channels 136 to cool the substrate support 126. A valve 170 and pump 172 may be used to evacuate reactants from the processing chamber 122. A system controller 178 may be used to control components of the substrate processing system 120.

A flow metrology system 180 is selectively connected by a valve 182 to an outlet of the manifold 160 for flow rate metrology. Valve 184 selectively connects the manifold 160 to the processing chamber 122 during normal operation.

Figure 2:
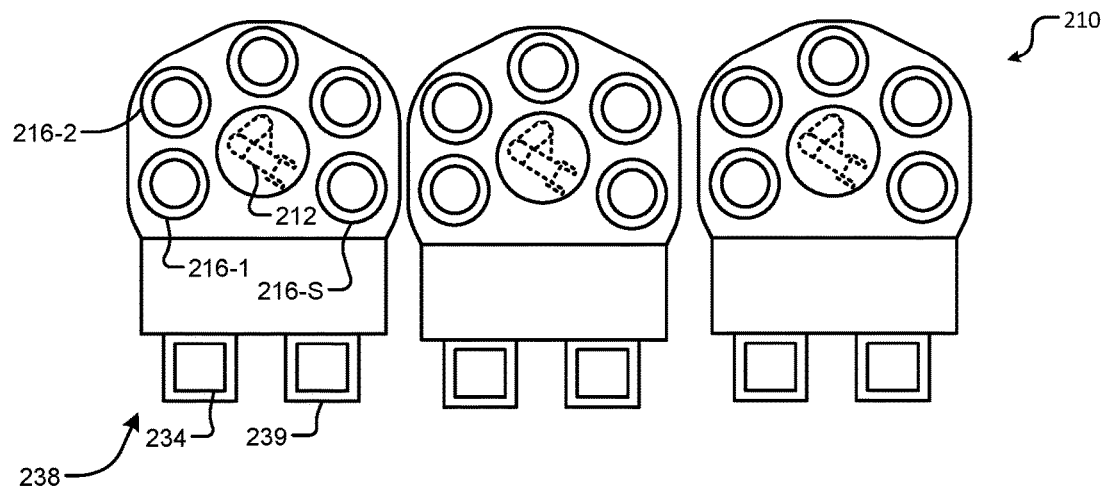
FIG. 2 is a functional block diagram of an example of substrate processing tools.

Referring now to FIG. 2, the flow metrology systems and methods described herein can be used to provide flow metrology for gas supplied to one or more substrate processing tools 210 to reduce cost. While an example of a substrate processing tool 210 is shown, other substrate processing tools can be used.

The substrate processing tool 210 includes a robot 212 arranged in a central location. The robot 212 may be operated at vacuum or atmospheric pressure. The substrate processing tool 210 includes a plurality of stations (or substrate processing chambers) 216-1, 216-2, . . . , and 216-S (collectively stations 216) (where S is an integer greater than one) arranged around the robot 212. The stations 216 may be arranged around a center of the substrate processing tool 210 with an equal or irregular angular offset. Examples of stations 216 may include one or more of deposition, etch, pre-clean, post clean, spin clean, etc.

The substrates may be initially located in a cassette 234. A robot and load lock generally identified at 238 may be used to move the substrates from the cassette 234 to the substrate processing tool 210. When processing is complete, the robot and load lock 238 may return the substrates to the cassette 234 and/or another cassette 239. As will be described further below, gas delivery systems supply gas to the stations and a flow metrology system calibrates the gas flows.

Figure 3:
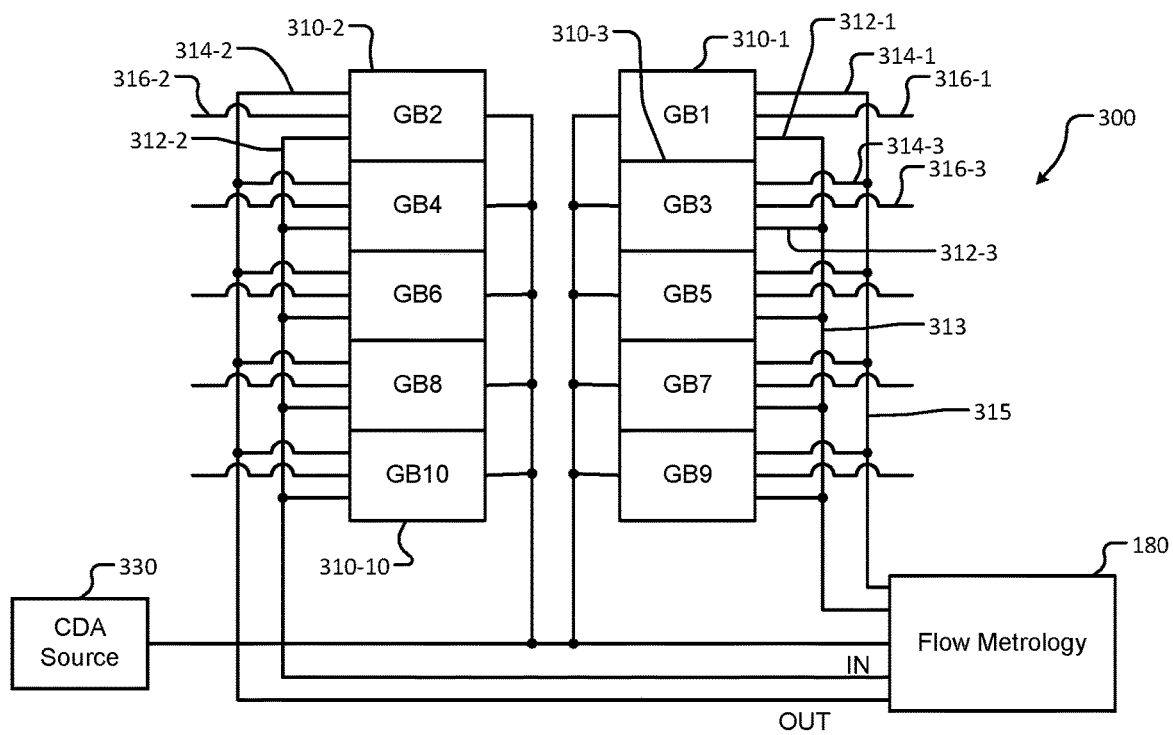
FIG. 3 is a functional block diagram of a gas delivery system according to the present disclosure that can be used in the systems of FIGS. 1 and 2.

Referring now to FIG. 3, a gas delivery system 300 including a plurality of gas boxes 310-1, 310-2, . . . 310-10 (collectively gas boxes 310) is shown. While ten (10) gas boxes are shown, the gas delivery system 300 can include additional or fewer gas boxes. The gas boxes 310-1, 310-2, . . . 310-10 are connected by first gas lines 312-1, 312-2, . . . 312-10 (collectively first gas lines 312) to a flow metrology system 180. The first gas lines 312 may be connected to a manifold 313 and then routed to the flow metrology system 180. Return gases from the flow metrology system 180 are connected by second gas lines 314-1, 314-2, . . . 314-10 (collectively second gas lines 314) to the gas boxes 310-1, 310-2, . . . 310-10. The second gas lines 314 flow out of the flow metrology system 180 into a manifold 315 and are separated into individual lines that are connected to the gas boxes 310-1, 310-2, . . . 310-10.

Gas lines 316-1, 316-2, . . . 316-10 (collectively gas lines 316) connect outputs of the gas boxes 310-1, 310-2, . . . 310-10 to processing chambers. In some examples, a source of clean dry air (CDA) 330 is also connected to the gas boxes 310-1, 310-2, . . . 310-10. As can be appreciated, the flow metrology system 180 is shared or time multiplexed by the gas boxes 310-1, 310-2, . . . 310-10, which reduces cost.

Figures 4, 5:
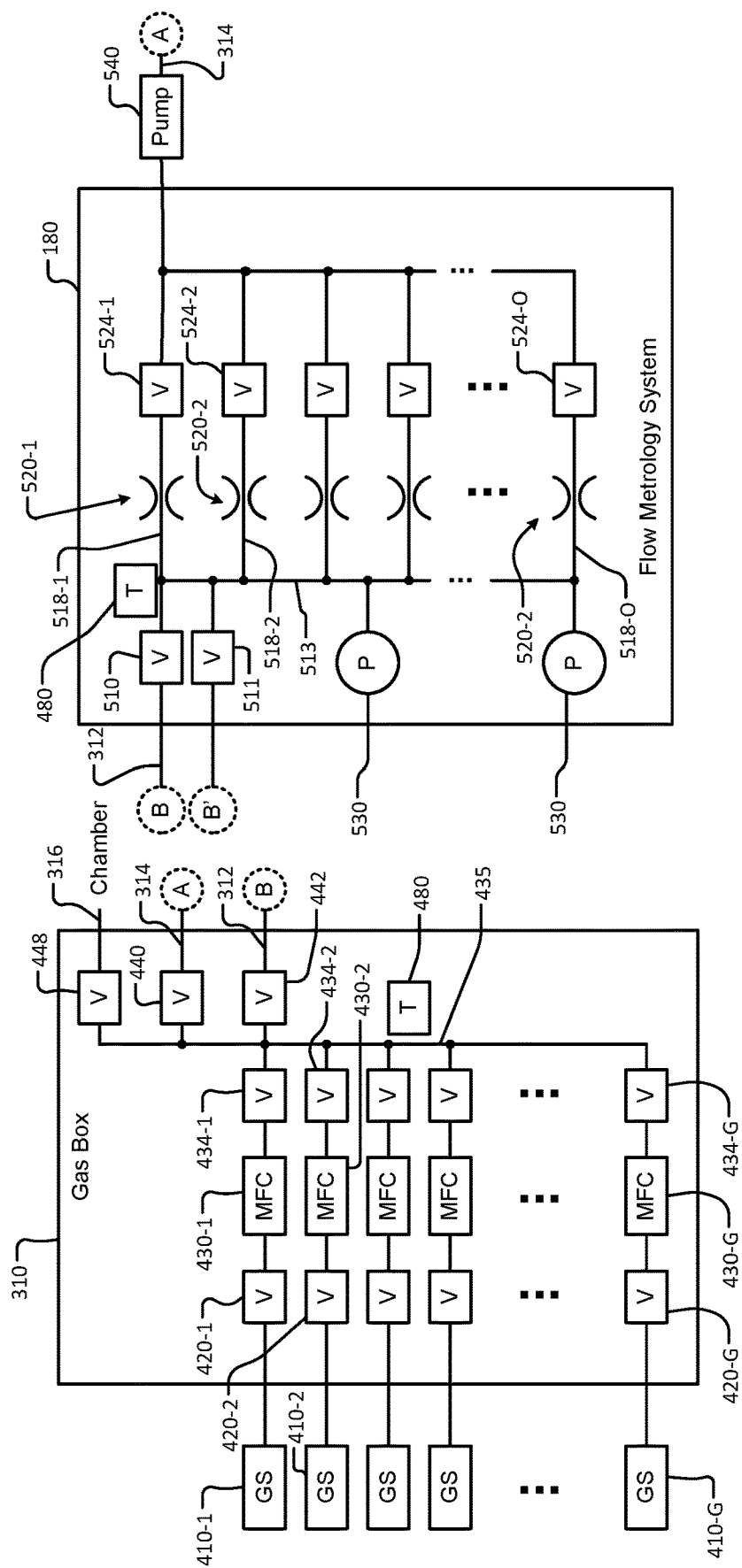
FIG. 4 is a functional block diagram of an example of a gas box according to the present disclosure.
FIG. 5 is a functional block diagram of an example of a flow metrology system according to the present disclosure.

Referring now to FIG. 4, one of the gas boxes 310 is shown. Gas sources 410-1, 410-2, . . . , and 410-G (collectively gas sources 410) are connected to flow control devices including primary valves 420-1, 420-2, . . . , and 420-G (where G is an integer greater than 1) (collectively primary valves 420), mass flow controllers (MFC) 430-1, 430-2, . . . 430-G (collectively MFC 430), and secondary valves 434-1, 434-2, . . . , and 434-G (collectively secondary valves 434). Outputs of the secondary valves 434 are connected to a mixing manifold 435 and are input to the valves 440, 442 and 448. The valves 440, 442 are connected to the flow metrology system 180. The valve 442 is associated with gas flowing to the flow metrology system 180 in the gas lines 312. The valve 440 is associated with gas returning from the flow metrology system 180 in the second gas lines 314. The valve 448 is associated with gas flowing in the gas lines 316 to the processing chamber associated with the gas box 310. One or more temperature sensors 480 can be used to sense a temperature of the gas lines. In some examples, portions of the gas lines are heated by resistive heaters (not shown).

Referring now to FIG. 5, the flow metrology system 180 is shown. An inlet B to the flow metrology system 180 is connected to a valve 510. An inlet B' associated with the gas boxes GB2, GB4, GB6, GB8 and GB10 is connected to a valve 511. Outlets of the valves 510 and 511 are connected by a manifold 513 to a plurality of gas lines 518-1, 518-2, . . . , and 518-O (where O is an integer greater than or equal to one) (collectively gas lines 518). The gas lines 518 are connected to precision orifices 520-1, 520-2, . . . , and 520-O (collectively precision orifices 520).

In some examples, precision orifices 520 have varying orifice sizes. The precision orifices 520 are considered "precise" if the orifice has a predetermined known size and shape and is unobstructed. One or more pressure sensors 530 sense pressure upstream from the precision orifice 520 when the precision orifice is operated in a choked flow condition. The choked flow condition occurs when gases flow through the precision orifice at sonic velocity. One of the precision orifices is selected based on the gas and the flow rate to be calibrated.

The pressure sensors 530 are connected to an outlet of the valves 510 and 511 and inlets of the precision orifices 520. For example, a first one of the pressure sensors 530 operates in a first pressure range and a second one of the pressure sensors 530 operates in a second pressure range that is the same as or different than the first pressure range. For example, the first one of the pressure sensors 530 measures pressure up to 50 T and the second one of the pressure sensors 530 measures pressure up to 500 T, although other pressure ranges can be used. The precision orifices 520 are connected to inlets of valves 524-1, 524-2, . . . , and 524-O (collectively valves 524). Outlets of the valves 524 are connected together and output to a pump 540.

Figure 6:
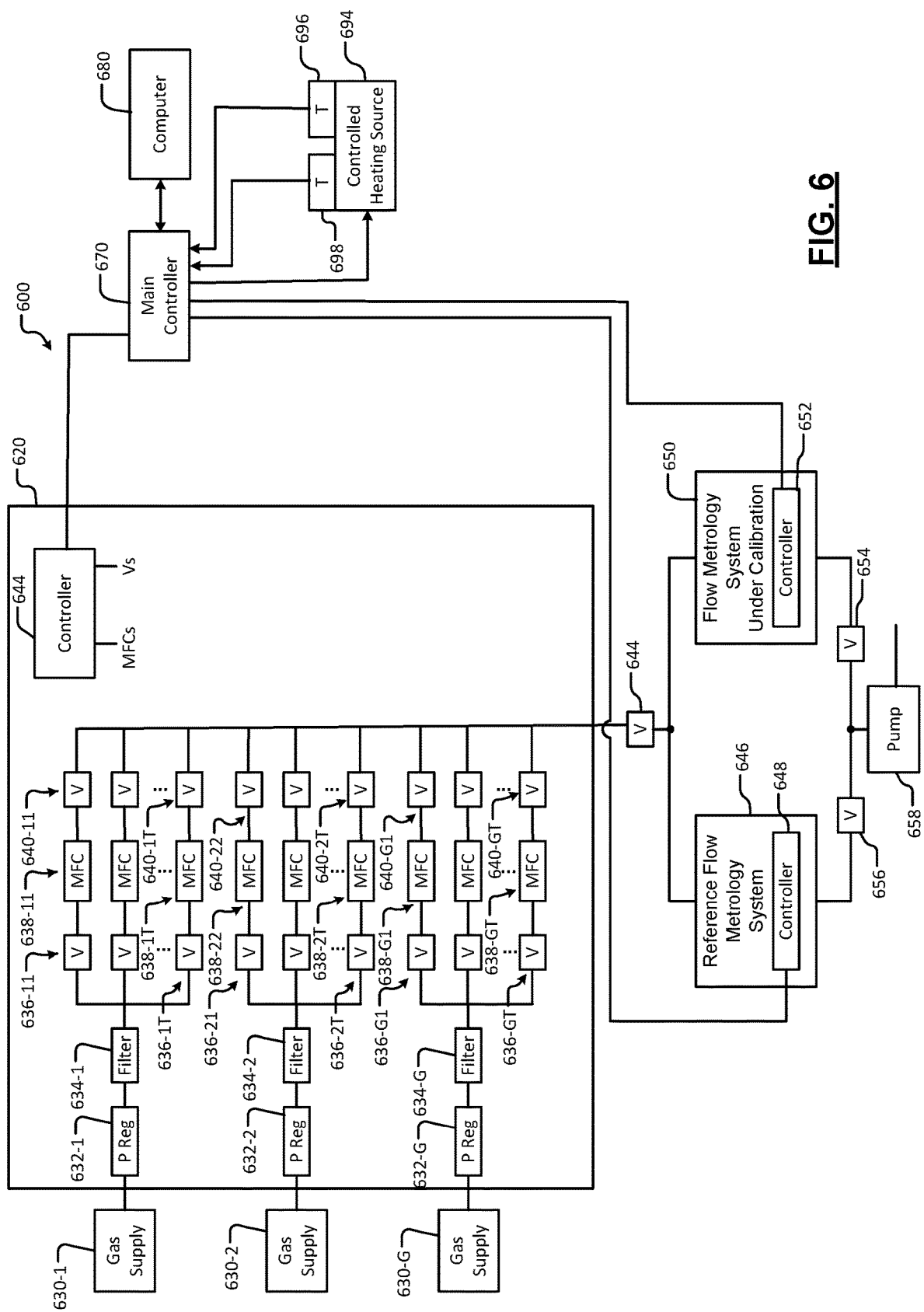
FIG. 6 is a functional block diagram of an example of a flow metrology calibration system for the flow metrology system of FIG. 5 according to the present disclosure.

Referring now to FIG. 6, a calibration system 600 is shown. The calibration system 600 includes a gas box 620 with pressure regulators 632-1, 632-2, . . . , and 632-G (collectively pressure regulators 632), filters 634-1, 634-2, . . . , and 634-G (collectively filters 634), primary valves 636-11, . . . , and 636-GT (where G and T are integers) (collectively primary valves 636), mass flow controllers (MFCs) 638-11, . . . , and 638-GT (collectively MFCs 638), and secondary valves 640-11, . . . , and 640-GT (collectively secondary valves 640). A valve 644 is arranged between the valves 640 and inlets of the reference or golden flow metrology system 646 and the flow metrology system 650 under calibration. A controller 644 of the gas box 620 communicates with and controls the primary valves 636 and the secondary valves 640 and the MFCs 638.

The reference or golden flow metrology system 646 includes a controller 648 and the flow metrology system 650 under calibration also includes a controller 652. The controllers 648, 652 control valves, MFCs and receive temperature and pressure signals. The controller 648, 652 also include gas tables. An outlet of the reference or golden flow metrology system 646 is connected by a valve 656 to a pump 658. An outlet of the flow metrology system 650 under calibration is connected by a valve 654 to the pump 658. A main controller 670 communicates with the controllers 644, 648 and 652 and coordinates calibration. A computer 680 calculates the transfer functions and performs interpolation for gases other than the calibration gases that are used.

A controlled heat source 694 can be used to controllably heat the UUT and golden temperature sensors 696 and 698 to a plurality of temperatures in the predetermined operating temperature range. The temperature transfer function is generated from the measured temperatures.

In some examples, the gas box 620 is connected to three calibration gas sources of various molecular weights (i.e., $N_2$, He and $C_4F_8$). In other words in these examples, G=3 although additional (G>3) or fewer (G=2) calibration gas sources can be used. Only one of the MFCs 638 is operated at a time.

The MFC flown gas can be directed to the golden flow metrology system 646 and/or to the UUT flow metrology system 650 using the intervening valves. The golden and UUT flow metrology systems 646, 650 are connected in parallel and both units are connected to the pump 658. Gas supply weldments or conduit for the golden and UUT flow metrology systems 646, 650 are made with the same length, internal diameter and internal volume. Similarly, the pump foreline weldments or conduit for the golden and UUT flow metrology systems 646, 650 are made with the same length, internal diameter and internal volume. The flow calibration system is controlled by the main controller 670.

Figure 7A:
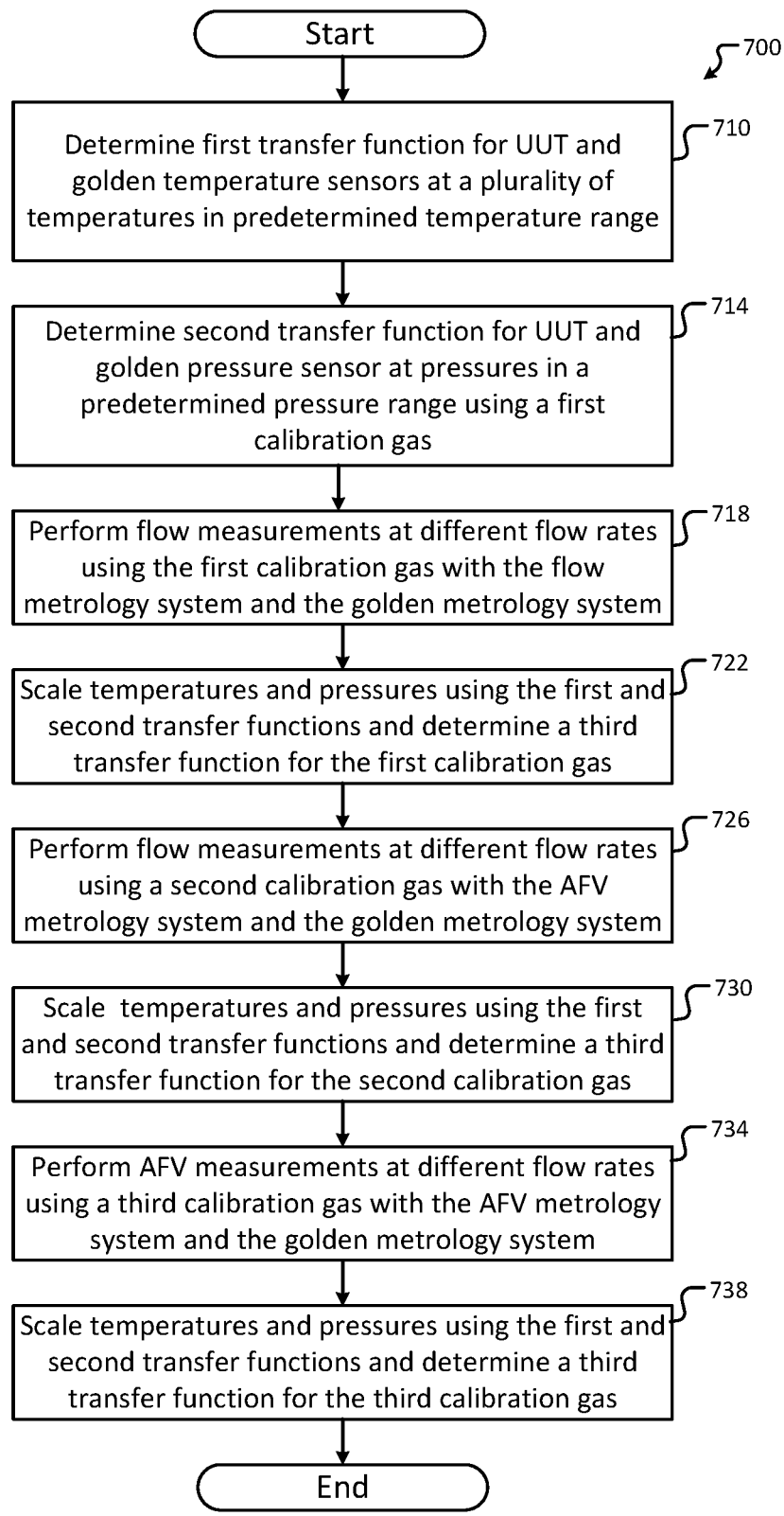
FIGS. 7A and 7B are flowcharts of examples of methods for calibrating the flow metrology system according to the present disclosure.
Figure 7B:
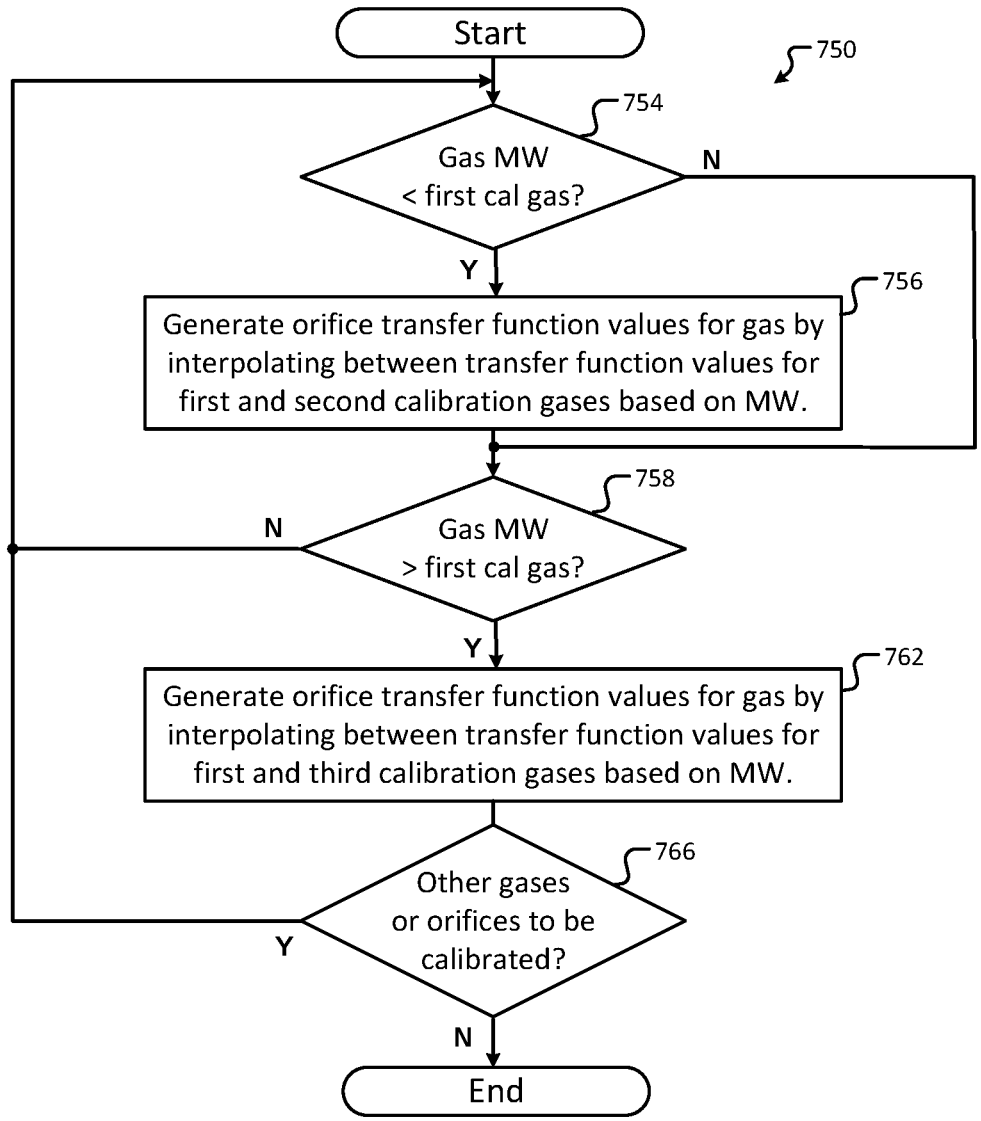

Referring now to FIGS. 7A and 7B, a method 700 for calibrating a flow metrology system is shown. At 710, a first transfer function is determined for the UUT temperature sensor and the golden temperature sensor at a plurality of temperatures in a predetermined operating temperature range. At 714, a second transfer function is determined for the UUT manometer and the golden manometer at pressures in a predetermined operating pressure range using the first calibration gas.

At 718, multiple flow measurements in a predetermined flow rate range are made using the first calibration gas with the flow metrology system and the golden metrology system. At 722, the measured temperatures and pressures are scaled using the first and second transfer functions (calculated in 710 and 714) and a third or orifice transfer function is determined for the first calibration gas.

At 726, multiple flow measurements in the predetermined flow rate range are made using a second calibration gas (that has a molecular weight that is lighter than the molecular weight of the first calibration gas) with the flow metrology system and the golden metrology system. At 730, the measured temperatures and pressures are scaled using the first and second transfer functions (calculated in 710 and 714) and a third or orifice transfer function is determined for the second calibration gas.

At 734, multiple flow measurements in the predetermined flow rate range are made using a third calibration gas (that has a molecular weight that is heavier than the molecular weight of the first calibration gas) with the flow metrology system and the golden metrology system. At 738, the measured temperatures and pressures are scaled using the first and second transfer functions (calculated in 710 and 714) and a third or orifice transfer function is determined for the third calibration gas.

Once the third or orifice transfer functions are determined for the calibration gases, a method 750 can be used to determine orifice transfer functions for other gases having different molecular weights than the calibration gases. At 754, the method determines whether the gas to be calibrated has a molecular weight that is less than the first calibration gas. If 754 is true, the method generates an orifice transfer function for the gas by interpolating between transfer function values for the first and second calibration gases based on the molecular weights of the gas, the first calibration gas and the second calibration gas. If 754 is false, the method determines whether the gas to be calibrated has a molecular weight that is greater than the first calibration gas at 758. If 754 is true, the method generates an orifice transfer function for the gas by interpolating between transfer function values for the first and third calibration gases based on the molecular weights of the gas, the first calibration gas and the third calibration gas. At 766, the method determines whether other gases or precision orifices need to be calibrated. If 766 is true, then the method returns to 754. Otherwise the method ends.

Figure 8:
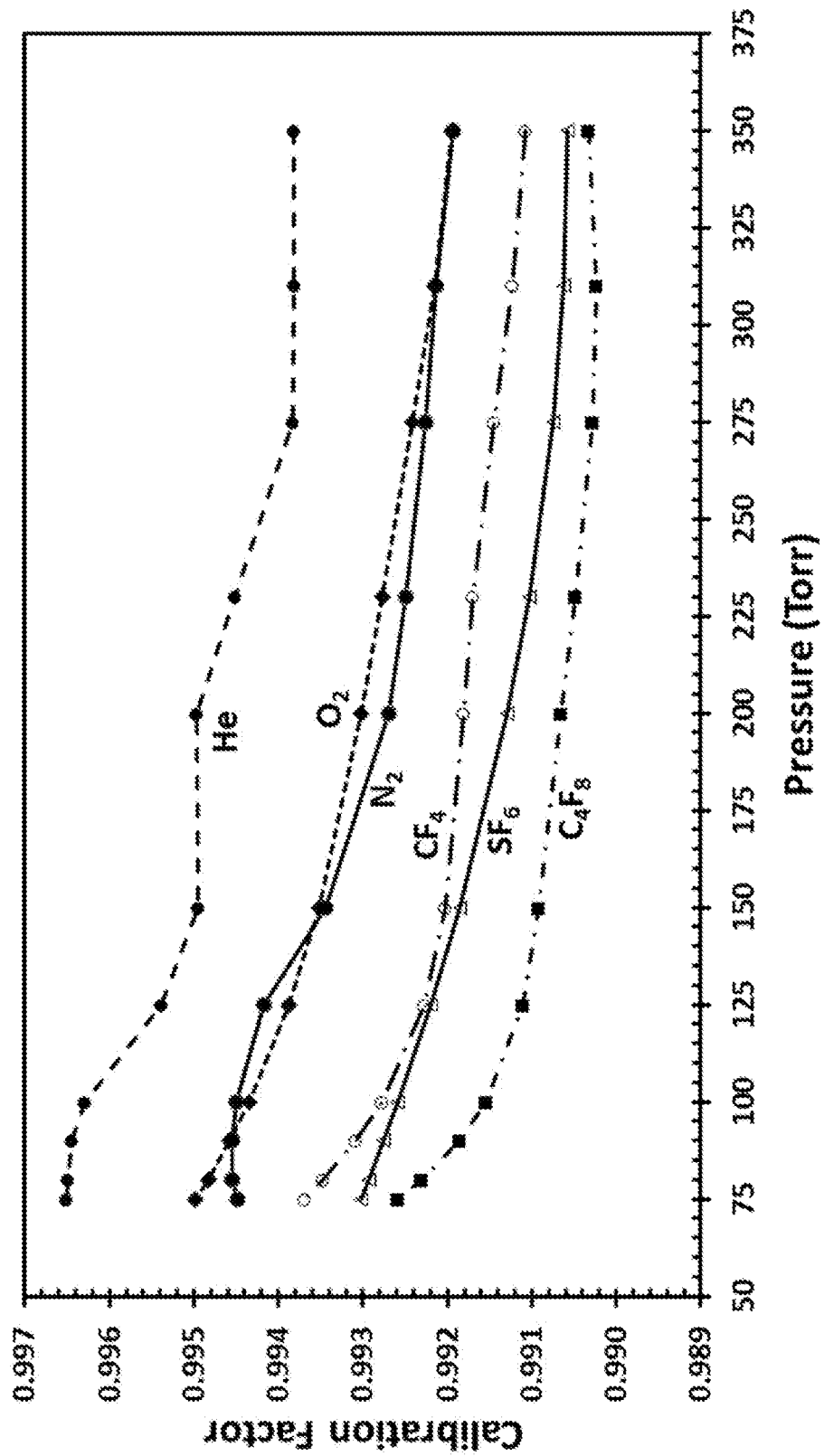
FIG. 8 is graph illustrating an example of a calibration factor as a function of pressure for various gases.
Figure 9:
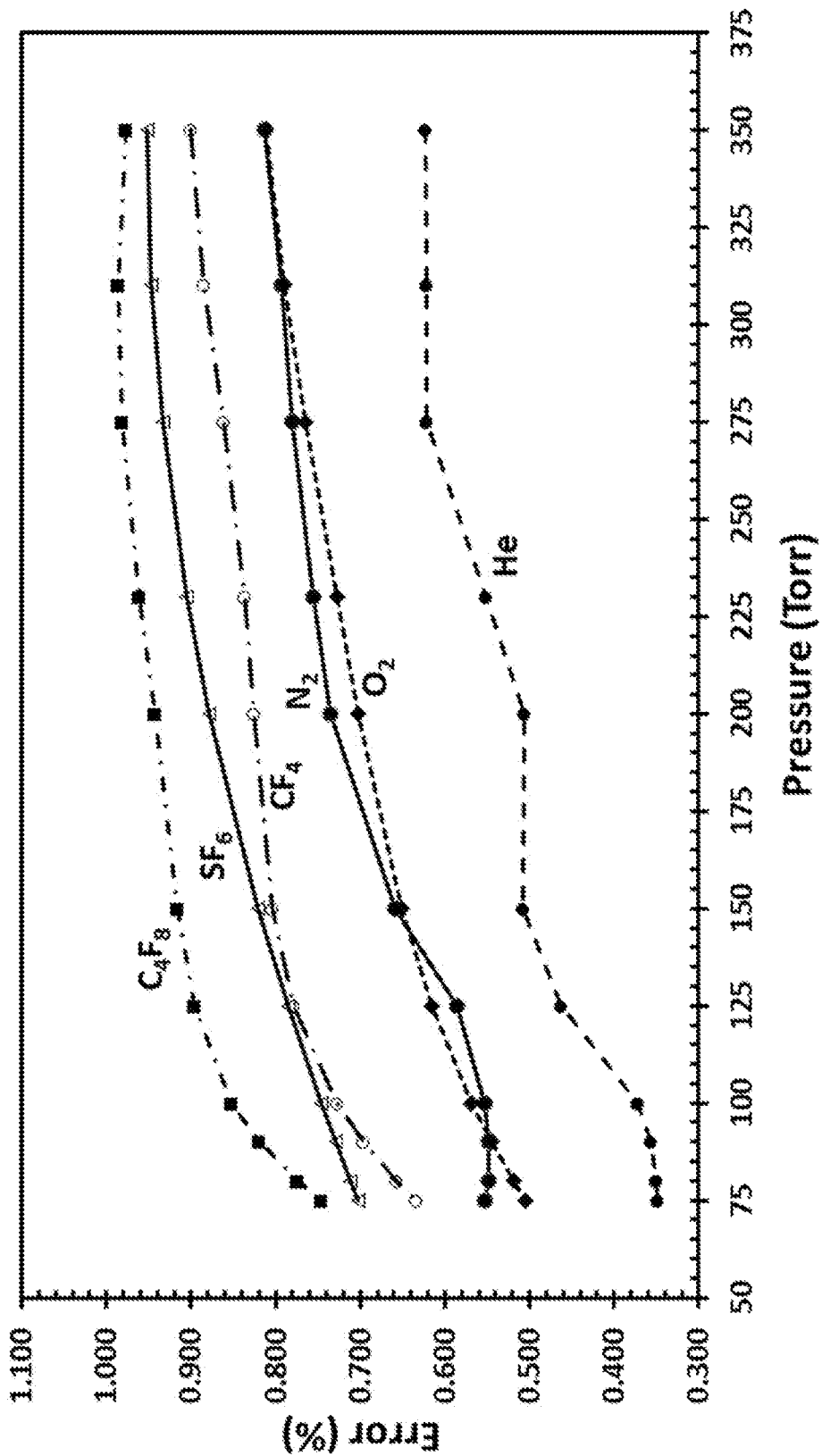
FIGS. 9-11 are graphs of examples illustrating error as a function of pressure for various gases.
Figure 10:
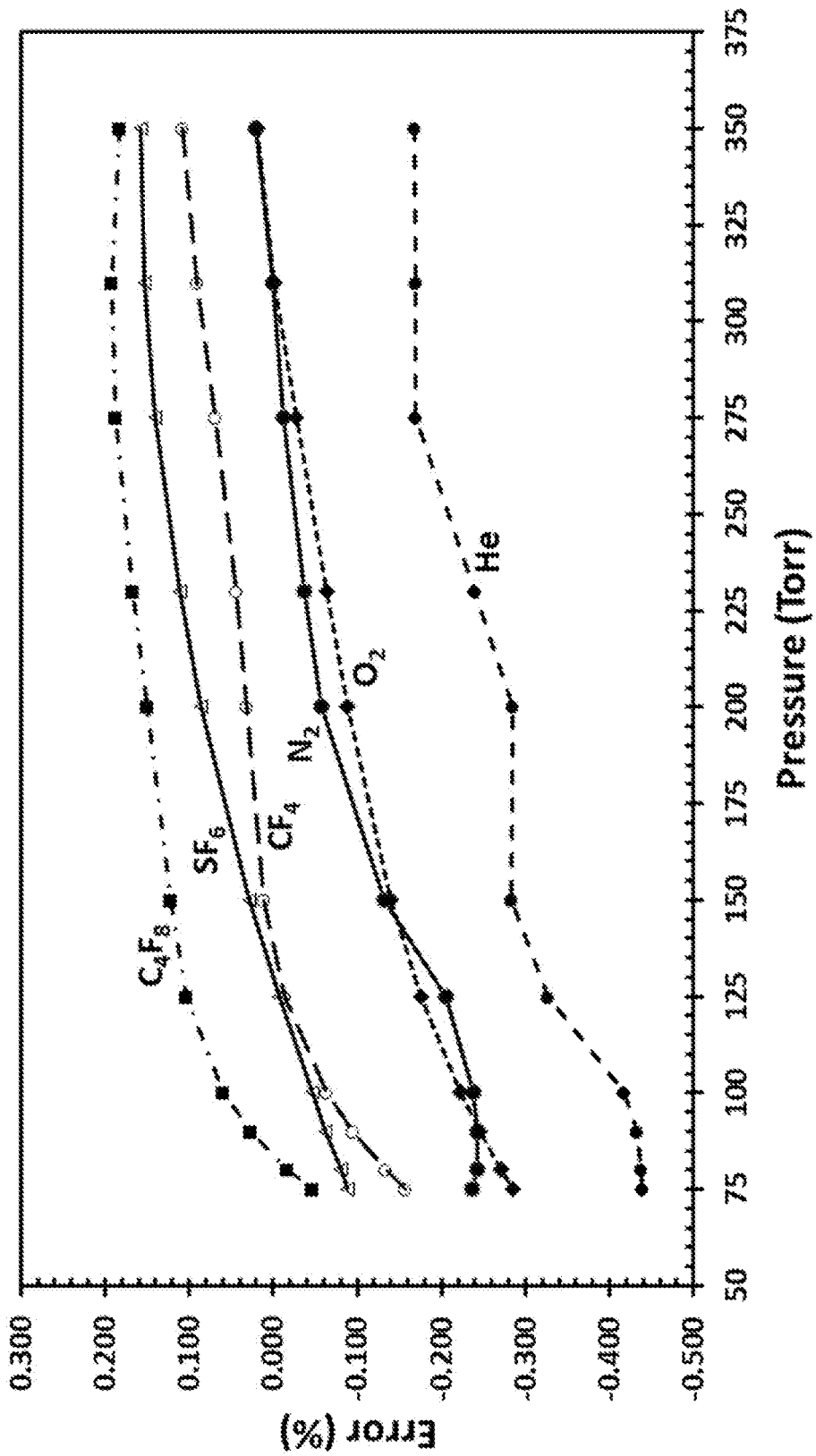

Referring now to FIGS. 8-10, experimental data demonstrates the advantages of calibration described herein and the significance of the variable calibration method. The measurements were taken using gases of various molecular weights (light gases such as He, heavy polyatomic gas such as $C_4F_8$ and gases of intermediate molecular weights such as $N_2$, $O_2$, $CF_4$ and $SF_6$). In addition, the data were collected using a 0.015" ID orifice over the complete operating orifice pressure range to demonstrate flow rate effects.

In FIG. 8, variation is shown in the computed transfer function $f_{orifice_i}^{gas}(p)$, (also referred herein as orifice calibration factor). In FIG. 8, significant variation is seen between lighter to heavier gases and for different pressures. If the orifice pressure is not scaled with the corresponding calibration factor for each gas and flow rate, then this can lead to significant error in absolute flow rate prediction as is shown in FIG. 9. The percent error is defined with respect to the MFC flow set point:

$$\text{Error} = 100 * \frac{(\overline{Q} - SP)}{SP} \quad (12)$$

If a single calibration factor is used, based on $N_2$ 310 Torr data point for example, then the absolute flow rate error reduces to within −0.5% to 0.3%, as shown in FIG. 10, but there is no improvement in the within-gas variation with operating pressure (flow set point) or the relative difference from gas-gas.

Figure 11:
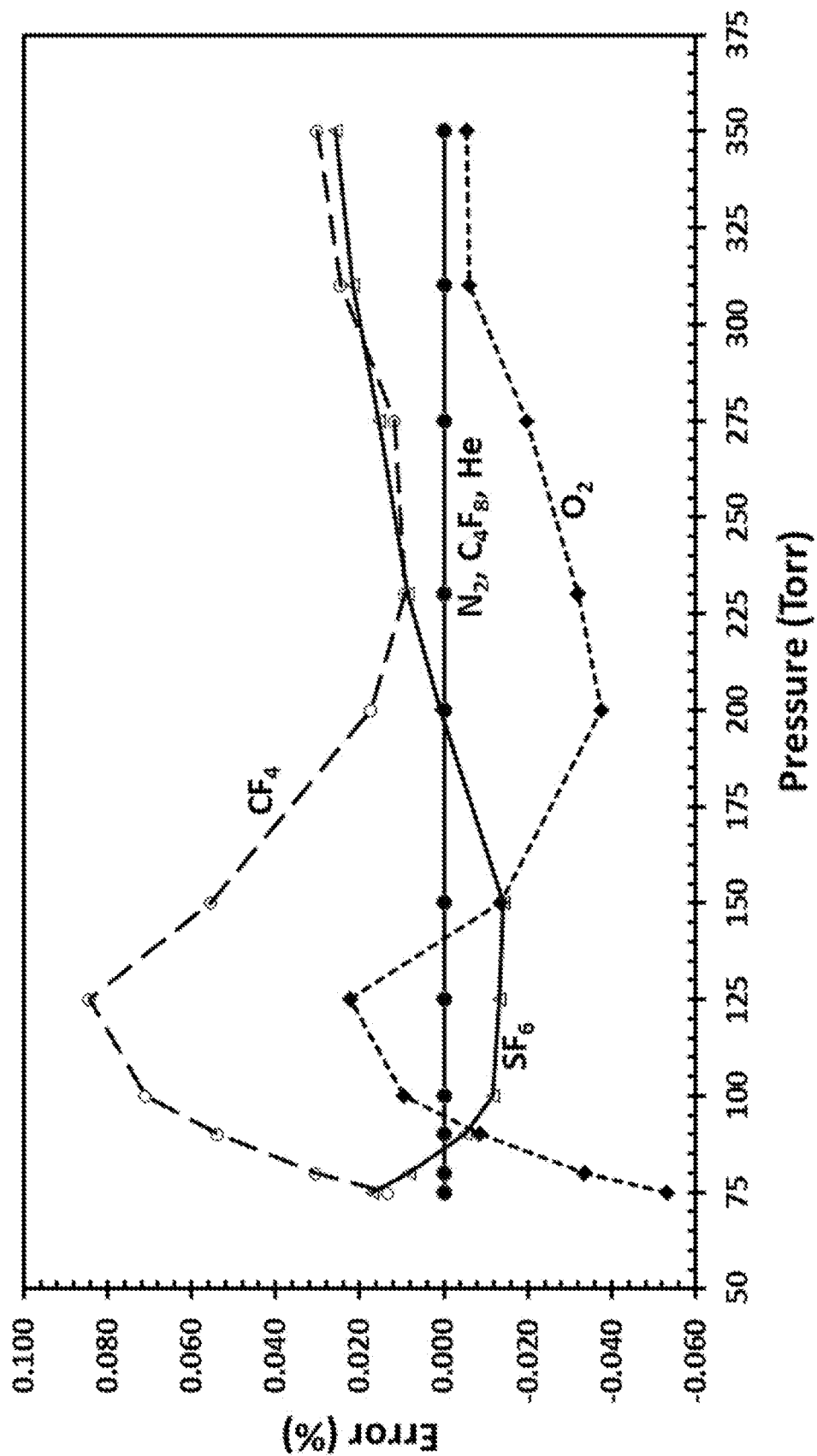

Referring now to FIG. 11, the variable calibration method was tested next by employing different transfer functions for each gas and orifice pressure. As described above, the calibration factors for $N_2$, He and $C_4F_8$ gases are equal to 1 since they are computed based on actual experimental data during factory calibration of the metrology system. For other gases, the calibration factors are determined from $N_2$, $C_4F_8$ and He data by interpolating based on molecular weights as described above.

As show in FIG. 11, the proposed method can reduce the calibration error on absolute flow rate prediction significantly to well within +0.1% for all gases and over the entire range. The improvement in performance and unit-to-unit variation of production metrology units is expected to provide improved chamber flow matching.

The present disclosure provides an advanced calibration methodology for optimizing the performance of orifice-based flow metrology systems for better chamber flow matching of semiconductor etch tools over the entire operating flow range and for all process gases. Advantages of the method include significant reduction on unit-to-unit variation (reproducibility) of manufactured orifice-based metrology systems for better chamber flow matching. Additional advantages include a significant improvement on accuracy MFC absolute flow rate measurement without any jumps at orifice transitions due to more concise calibration to the proven golden flow metrology standard over the entire operating flow range and for all process gases. In addition, the method allows for field replacement of manometers or temperature sensors if needed without any loss in accuracy and without having to replace the entire metrology unit (which reduces cost and tool down time).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A calibration system for an orifice-based flow metrology system, comprising:
   a gas box including valves and mass flow controllers to selectively supply a first calibration gas, a second calibration gas and a third calibration gas:
   a first metrology system including a first temperature sensor, a first pressure sensor and a first orifice having a first orifice size;
   a reference metrology system including a second temperature sensor, a second pressure sensor and a second orifice having the first orifice size;
   a controlled heating source configured to heat the first temperature sensor and the second temperature sensor;
   a controller configured to:
   a) cause the controlled heating source to heat the first temperature sensor and the second temperature sensor to a plurality of temperatures in a predetermined operating temperature range;
   b) cause a first transfer function to be generated based on first and second temperatures sensed by the first and second temperature sensors, respectively;
   c) cause the first calibration gas to be supplied at a plurality of pressures in a predetermined pressure range and a second transfer function to be generated based on first and second pressures sensed by the first and second pressure sensors, respectively;
   d) cause a first plurality of flow rate measurements to be performed in a predetermined flow rate range with the first metrology system and the reference metrology system, wherein the first metrology system and the reference metrology system use the first calibration gas; and
   e) cause temperature and pressure to be calibrated using the first transfer function and the second transfer function, respectively, and a corresponding transfer function to be determined for the first calibration gas based on the first plurality of flow rate measurements.

2. The calibration system of claim 1, wherein the controller is further configured to cause:
   f) a second plurality of flow rate measurements to be performed in the predetermined flow rate range with the first metrology system and the reference metrology system, wherein the first metrology system and the reference metrology system use the second calibration gas having a molecular weight that is different than a molecular weight of the first calibration gas; and
   g) temperature and pressure to be calibrated using the first transfer function and the second transfer function, respectively, and a corresponding transfer function to be determined for the second calibration gas based on the second plurality of flow rate measurements.

3. The calibration system of claim 2, wherein the molecular weight of the second calibration gas is lower than the molecular weight of the first calibration gas.

4. The calibration system of claim 2, wherein the controller is further configured to cause:
   h) a third plurality of flow rate measurements to be performed in the predetermined flow rate range with the first metrology system and the reference metrology system, wherein the first metrology system and the reference metrology system use the third calibration gas having a molecular weight that is different than the molecular weight of the first calibration gas and the second calibration gas; and
   i) temperature and pressure to be calibrated using the first transfer function and the second transfer function, respectively, and a corresponding transfer function to be determined for the third calibration gas based on the third plurality of flow rate measurements.

5. The calibration system of claim 2, wherein the molecular weight of the third calibration gas is higher than the molecular weight of the first calibration gas and the second calibration gas.

6. The calibration system of claim 4, wherein the controller is further configured to cause j) a corresponding transfer function to be calculated for an additional gas by performing interpolation between transfer function values of the corresponding transfer functions for at least two of the first calibration gas, the second calibration gas and the third calibration gas.

7. The calibration system of claim 6, wherein the controller is configured to repeat a) to j) for one or more additional gases.

8. The calibration system of claim 6, wherein the controller is configured to repeat a) to j) for another orifice having a different size than the first orifice size.

* * * * *